US009337395B2

(12) United States Patent
Kalem

(10) Patent No.: US 9,337,395 B2
(45) Date of Patent: May 10, 2016

(54) METHODS FOR PRODUCING NEW SILICON LIGHT SOURCE AND DEVICES

(75) Inventor: Seref Kalem, Kocaeli (TR)

(73) Assignee: TUBITAK, Ankara (TR)

( * ) Notice: Subject to any disclaimer, the term of this patent is extended or adjusted under 35 U.S.C. 154(b) by 0 days.

(21) Appl. No.: 14/397,861

(22) PCT Filed: Apr. 30, 2012

(86) PCT No.: PCT/IB2012/052146
§ 371 (c)(1),
(2), (4) Date: Oct. 30, 2014

(87) PCT Pub. No.: WO2013/164659
PCT Pub. Date: Nov. 7, 2013

(65) Prior Publication Data
US 2015/0132870 A1    May 14, 2015

(51) Int. Cl.
| | | |
|---|---|---|
| H01L 21/00 | (2006.01) | |
| H01L 33/40 | (2010.01) | |
| H01L 33/34 | (2010.01) | |
| H01S 5/183 | (2006.01) | |
| H01S 5/22 | (2006.01) | |
| H01S 5/30 | (2006.01) | |
| H01S 5/32 | (2006.01) | |
| H01L 29/78 | (2006.01) | |
| H01L 33/00 | (2010.01) | |
| H01S 5/02 | (2006.01) | |
| H01S 5/042 | (2006.01) | |
| H01S 5/187 | (2006.01) | |

(52) U.S. Cl.
CPC ............ *H01L 33/40* (2013.01); *H01L 29/7831* (2013.01); *H01L 33/002* (2013.01); *H01L 33/0041* (2013.01); *H01L 33/0054* (2013.01); *H01L 33/346* (2013.01); *H01S 5/0208* (2013.01); *H01S 5/0425* (2013.01); *H01S 5/183* (2013.01); *H01S 5/187* (2013.01); *H01S 5/22* (2013.01); *H01S 5/2201* (2013.01); *H01S 5/304* (2013.01); *H01S 5/3227* (2013.01); *H01L 2933/0016* (2013.01)

(58) Field of Classification Search
CPC ....... H01L 21/00; H01L 33/00; H01L 33/002; H01L 33/0041; H01L 33/0054; H01L 33/346; H01L 33/40; H01L 29/7831
USPC ................... 257/79, 607, 98, 291, 99; 438/22; 372/38.05
See application file for complete search history.

(56) References Cited

U.S. PATENT DOCUMENTS

| | | | | |
|---|---|---|---|---|
| 5,872,387 A * | 2/1999 | Lyding | ............ | H01L 21/28176 257/607 |
| 6,248,539 B1 | 6/2001 | Ghadiri et al. | | |
| 6,444,533 B1 * | 9/2002 | Lyding | .............. | H01L 21/28176 257/E21.194 |
| 6,579,630 B2 * | 6/2003 | Li | ........................ | H01L 51/0038 252/301.16 |
| 6,846,565 B2 * | 1/2005 | Korgel | .................... | B82Y 10/00 257/E21.114 |
| 7,163,902 B2 * | 1/2007 | Yang | .................... | H01L 33/0054 257/E21.002 |
| 7,693,195 B2 | 4/2010 | Feng et al. | | |
| 8,436,333 B2 * | 5/2013 | Saito | ....................... | H01L 33/34 257/13 |
| 8,576,400 B2 * | 11/2013 | Hulteen | ................ | G01N 21/274 240/458.1 |
| 2002/0163003 A1 | 11/2002 | Dal Negro Luca | | |
| 2009/0090925 A1 * | 4/2009 | Saito | ..................... | B82Y 20/00 257/98 |
| 2009/1090925 | 4/2009 | Shinichi | | |
| 2010/0272140 A1 | 10/2010 | Walter et al. | | |

FOREIGN PATENT DOCUMENTS

| | | |
|---|---|---|
| DE | 102006047071 A1 | 12/2007 |
| EA | 013649 B1 | 6/2010 |
| WO | WO9419829 A1 | 9/1994 |
| WO | WO97/26676 A1 | 7/1997 |
| WO | WO99/12035 A1 | 3/1999 |
| WO | WO0192923 A1 | 12/2001 |
| WO | WO2007138078 A1 | 12/2007 |

OTHER PUBLICATIONS

T. Matsumoto, Isotope energy shift of luminescence in hydrogen and deuterium terminated porous silicon, Bulletin of Material Science, vol. 22, No. 3, May 1, 1999, pp. 369-376, XP002690105.

M. Kittler, Silicon basd emitters, Physica Status Solidi (A), vol. 203, No. 4, Jan. 1, 2006, pp. 802-809, XP2445451.

A. I. Belogorokhov, FTIR investigation of porous silicon formed in deutrof luoric acid based solutions, Physica Status Solidi (A), vol. 202, No. 8, Jan. 1, 2005, pp. 1581-1585, XP002690107.

Veksler M I, Electroluminescence of Silicon MIS Tunneling Structures, Technical Physics Letters, American Institute of Physics, New York, US, vol. 21, No. 7, Jul. 1, 1995, pp. 530-532, XP000519411.

Seref Kalem, Photoluminescence from silicon nanoperticles embedded in ammonium silicon hexafluoride, Nanotechnology, IOP, Bristol, GB, vol. 21, No. 43, Oct. 29, 2010, p. 435701, XP020182142.

(Continued)

*Primary Examiner* — Jae Lee
*Assistant Examiner* — Colleen E Snow
(74) *Attorney, Agent, or Firm* — Gokalp Bayramoglu

(57) ABSTRACT

The present invention relates to production method and device applications of a new silicon (Si) semiconductor light source that emits at a single wavelength at 1320 nm with a full width at half maximum (FWHM) of less than 200 nm and a photoluminescence quantum efficiency of greater than 50% at room temperature. The semiconductor that is the base for the new light source includes a surface which is treated by an acid vapor involving heavy water or Deuterium Oxide (D2O) and a surface layer producing the light source at 1320 nm.

1 Claim, 6 Drawing Sheets

(56) References Cited

OTHER PUBLICATIONS

A. E. Pap, Thermal oxidation of porous silicon, Study on structure, Applied Physics Letters, vol. 86, Jan. 18, 2005, pp. 041501-1-041501-3, XP002898814.

M. Balucani, oxidised porous silicon waveguide technology for silicon optoelectronics, IEEE Lasers and Electro-Optics Society, vol. 2, No. wdd4, Nov. 8, 1999, pp. 648-644, XP002696615.

B. Pellegrini, Journal of Physics D Applied Physics, vol. 9, 1976, pp. 55-68, XP002696616.

A. D. Rakic, opticl prosperties of metallic films for vertical cavity optoelectronic devices, Applied Optics, vol. 37, No. 22, Aug. 1, 1998, pp. 5271-5283, XP002696617.

Mizsei J et al: "Effect of deuterium on passivation of Si surfaces", Applied Surface Science 256, 5765 (2010).

Kalem S et al: "Possibility of fabricating light emitting porous silicon from gas phase etchants", Optics Express 6, 8(2000).

Kalem S: "Possible low-k solution and other potential applications", European Semiconductor 26, Nr.7(2004).

Kalem S: "Synthesis of ammonium silicon florit on silicon by dry etching", Applied Surface Science 236, 336(2004).

Kittler M et al: "Silicon based light emitter", Phys. Stat. Sol.(a) 203, 807 (2006).

Kittler M et al: "Stark effect at dislocations in silicon for modulation of a 1.5 μm light emitter", Silicon Photonics III, edited by Joel A. Kubby, Graham T. Reed, Proc. of SPIE, vol. 6898, 68980G, (2008).

Saito S et al: "Silicon light emitting transistor for on-chip optical interconnection", Applied Physics Letters 89, 163504(2007).

T Hoang et al: IEEE Trans. on Electron Devices 54, 1860(2007).

O King et al: Physical Rev. B 50, 10661(1994).

Kittler et al: "Silicon based light emitters", Physics Status Solidi A 203, 802(2006).

R.P. Schmid et al: Phys. Status Solidi A 208, 888(2011).

King O et al: "Impurity related photoluminescence from silicon room temperature", Physical Review B 50, 10661(1994).

Talalaev VG et al. "Miniband related 1400-1800nm luminescence of Si/Ge quantum dot superlattices", Nanoscale Research Letters 1, 137(2006).

Rumpler JJ et al: IEEE Photonics Technol Letters 21. 827(2009).

Yu et al: "Properties of dislocation networks formed by Si wafer direct bonding, Materials Science in Semi-conductor Processing", vol. 9, 2006, p. 96.

McHedlidze T et al: "Determination of the origin of dislocation related lumi-nescence from silicon using regular dislocation Networks", Solid State Phenomena, 156-158, (2010) 567.

Lo Savio et al; "Room temperature emission at telecommu-nication wavelengths from silicon photonic crystal nanocatities", Appl. Phys. Letters 98, 201106 (2011).

Tseng HH et al: "ALD HfO2 using heavy water for improving MOSFET stability", IEEE IEDM 83(2003).

M. Cheung et al, SPIE J.: Nanophotonics 5, 053503(2011).

D. Misra and RK Jarvval, J. Electrochem. Soc. 149, G446 (2002).

T. Matsumoto et al: Nanotechnology 11, 340(2000).

S. Kalem et al: Nanotecnology 22 (2011).

E. Frisch ET. J. Appl: Physics 90, 4777(2001).

\* cited by examiner

METHODS FOR PRODUCING NEW SILICON LIGHT SOURCE AND DEVICES

The present invention relates to production method and device applications of a new silicon (Si) semiconductor light source that emits a single peak at 1320 nm in the infrared between 800 nm and 1800 nm with a full width at half maximum (FWHM) of less than 200 nm and a photoluminescence quantum efficiency of greater than 50% at room temperature. The invention offers an exciting solution to silicon technology by providing with a photonic component where silicon is known to be a poor light emitter due to its indirect band gap.

This invention relates to a method for producing a new light source and devices having a great potential for use in next generation optical and electronic devices and emitting a strong single peak at 1320 nm in infrared region between 800-1800 nm. The semiconductor producing related light source involves a silicon surface treated by an acid vapor containing heavy water or deuterium oxide (D2O) and a layer on this surface which emits the light at 1320 nm. The invention relates to the production of a new silicon with superior optical properties, which does not contain emissions originating from band edge, defects and dislocations (e.g., band edge emission at around 1100 nm, dislocations at around 1500 nm and other defect emissions). This method consists of a surface oxidation process involving the formation of Si—O—Si, Si-D and N-D atomic bondings, where N, O, D are nitrogen, oxygen and deuterium, respectively.

This new technology can readily be integrated with the current Si technology in order to be used in applications such as optical communications, mobile platforms, free space communication, quantum information processing, monitoring, displays, coding modules, chemical and biological sensors and many others).

Beside its integration features with silicon technology, it enables the realization of high performance modules due to its ease of fabrication and low-cost. Particularly, high performance circuits and systems can be realized since it has unique properties for on-chip and interconnections between chips.

A part of the background hereof lies in the development of the surface treatment work of Si wafers by acid vapor during which ammonium silicon hexafluoride (NH4)2SiF6 is formed on silicon wafer surface. References can be made for example to:

KALEM, S, 'Microcrystalline and nanocrystalline structures with low dielectric constant for high tech applications', Eurasian Patent No. 013649 Issuing date: 30 Jun. 2010;

KALEM S ET AL, 'Possibility of fabricating light emitting porous silicon from gas phase etchants', OPTICS EXPRESS 6, 8(2000); KALEM S, 'Possible low-k solution and other potential applications' European Semiconductor 26, Nr. 7(2004); KALEM S, 'Synthesis of ammonium silicon florit on silicon by dry etching' Applied Surface Science 236, 336 (2004);

Silicon based infrared light sources can be obtained from dislocations networks oriented by wafer bonding. But, the light source obtained by this method gives a broad emission between 750 nm and 1900 nm: KITTLER M ET AL, 'Silicon based light emitter' Phys. Stat. Sol.(a) 203, 807(2006); Patent WO 2007/138078 A1 'Dislocation based light emitter with an MIS structure'; The light sources obtained by this approach formed a basis for the realization of new electronic devices. A modulator at 1.5 um can be given as an example: KITTLER M ET AL, 'Stark effect at dislocations in silicon for modulation of a 1.5 μm light emitter' Silicon Photonics III, edited by Joel A. Kubby, Graham T. Reed, Proc. of SPIE Vol. 6898, 68980G, (2008).

For their ability to pass through many semiconductor without getting absorbed, new optical transistors with light sources have been investigated by various methods and device structures: SAITO S ET AL, 'Silicon light emitting transistor for on-chip optical interconnection' Applied Physics Letters 89, 163504(2007); but also explored for III-V compound semiconductors by, WALTER ET AL, 'High speed light emitting semiconductor methods and devices US 2010/0272140 A1; FENG M ET AL 'Semiconductor light emitting devices and methods' U.S. Pat. No. 7,693,195 B2.

The need of semiconductor industry for silicon based light source working at 1320 nm optical communication window is becoming more and more important. The light source which is operational at this wavelength is a key parameter in a number of applications ranging from interconnects in multichip modules to printed circuit boards and free space optical communications. As an indirect band gap material, silicon can not emit a useful light at room temperature for applications. Light emission can be observed in infrared due to dislocations. But, the intensity of these emissions is very weak at room temperature, therefore they are useless. Demonstrated devices have a broad and multiple peak emission bands between 800-1800 nm: KITTLER et al., 'Silicon based light emitters', Physica Status Solidi A 203, 802(2006); R. P. Schmid et al., Phys. Status Solidi A 208, 888(2011).

It is possible to observe light emission in the infrared region (800-1800 nm) from silicon containing Silicon and Germanium quantum dots. Moreover, it has been demonstrated that the down scaling and strain enhance the band edge emission at around 1100 nm. Defects and impurities can always lead to sub-band gap emissions. But, these emissions are outside of the scope of the invention from method, material and emission energy point of view. References can be made for example to: KING O et al, 'Impurity related photoluminescence from silicon at room temperature' Physical Review B 50, 10661(1994); TALALAEV V G et al, 'Miniband related 1400-1800 nm luminescence of Si/Ge quantum dot superlattices' Nanoscale Research Letters 1, 137(2006);

According to the state of the art of the technology, there is no work demonstrating a single peak emission from silicon using heavy water containing acid vapor (HF:HNO3:D2O). Furthermore, no electronic device has been produced using the same method and technology.

Here are the patents and publications which could be related to the subject:

Dislocation based light emitter with an MIS structure Kittler M et al. WO2007138078(A1), 1.3 μm ve 1.5 μm photoluminescence which is obtained by wafer bonding and can only be observed at low temperature. YU ET AL: Properties of dislocation networks formed by Si wafer direct bonding, Materials Science in Semiconductor Processing, vol. 9, 2006, p. 96, Luminescence related to wafer bonding; MCHEDLIDZE T et al: Determination of the origin of dislocation related luminescence from silicon using regular dislocation Networks, Solid State Phenomena 156-158 (2010) 567; Lo SAVIO et al., Room temperature emission at telecommunication wavelengths from silicon photonic crystal nanocatities, Appl. Phys. Letters 98, 201106 (2011). In photonic crystals at room temperature, a broad luminescence between 1.3 μm ve 1.6 μm.

Deuterium has been used for different purposes in semiconductor research and manufacturing.

For example Deuterium has been used to improve the dielectric properties of some materials used in electronic devices. TSENG H H ET AL, 'ALD HfO2 using heavy water for improving MOSFET stability' IEEE IEDM 83(2003). This work aimed at improving HfO2 by atomic layer deposition (ALD). Deuterium was used in the production of low-loss optical materials. Reference can be made for example to: ZHANG Z WO01/92923 A1 'Application of deuterium oxide in producing silicon and metal containing materials for optical communication'.

In another example, the improvement of MOS structures has been carried out by annealing in deuterium atmosphere: BORIS L, WO 94/19829 'Semiconductor device comprising deuterium atoms'.

In the following example, deuterium has been used with HF vapor for cleaning and passivation of Si wafer surface: MIZSEI J at al. 'Effect of deuterium on passivation of Si surfaces' Applied Surface Science 256, 5765 (2010).

It has been shown that deuterium is satisfying dangling bonds very effectively at Si—SiO2 interfaces and thus reducing trap density which leads to improved CMOS characteristics at low voltages: D. MISRA and R K JARWAL, J. Electrochem. Soc. 149, G446 (2002). Diğer bir çalışmada fotolüminesansın azalmasını önlediği gösterilmiştir:

T. MATSUMOTO et al., Nanotechnology 11, 340(2000).

In another work, it was shown that transistors which were fabricated on wafers annealed in deuterium atmosphere enhanced the performance of the transistors: LYDING J W and HESS K, US005872387A 'deuterium treated semiconductor devices'.

The silicon light source emitting only a single peak at 1320 nm with more than 50% luminescence quantum efficiency has been produced for the first time using deuterium containing HF:HNO3 acid vapor. This invention differs from others from a single emission in the infrared band from 800 nm to 1800 nm and from a heavy water application point of view.

A concrete example of the invention is a light emission diode (LED) operating in infrared region at 320 nm and the invention ensures the realization of this device in accordance with the conventional silicon metallization technology.

In other words, this application is a process of making two and three terminal devices such as a transistor, sensor, laser, and light emitting devices (LED) using the new light emitting properties of silicon wafer.

In order to produce a LED, laser, sensor or optical output transistor, the surface of silicon wafer is treated by heavy water or deuterium oxide D2O containing acid vapor. A chemical mixture of HF:HNO3:D2O was used to form the acid vapor, where the weight ratio of HF solution can be between 40% and 50%. That of HNO3 solution is between 60% and 70%. The treatment is carried out at room temperature. The weight ratios of HF and HNO3 used in our experiments were typically 48% and 65%, respectively. The solutions are of semiconductor applications grade or GR for analysis. HF:HNO3:D2O mixture can be formed using 2 to 7 unit volume from HF, 1 to 12 unit volume from HNO3 and 1 to 6 unit volume from D2O.

As wafers, Silicon with p-type (5-20 Ohm-cm) and n-type (5-10 Ohm-cm) conductivities, <100> and <111> crystallographic orientations have been used for treatment. Moreover, highly doped silicon wafers with N+ and P+ doping were esued.

The wafers treated according to above mentioned method have been characterized by techniques such as photoluminescence (PL), current-voltage (I-V), Fourier transformed infrared spectroscopy (FTIR), scanning electron microscopy (SEM). These experiments have been made at room temperature.

FIG. 1(a) shows the SEM cross-sectional image of the structure formed on the surface of a wafer (4) when the wafer surface is treated by the vapor of HF:HNO3:D2O chemical mixture. As shown in the figure, the surface has a mesoporous or nanoporous structure. The surface of the wafer treated by this method exhibits a mesoporous or nanoporous silicon layer (3) and a porous deuterated ammonium silicon hexafluoride layer (6) with deuterium (ND4)2SiF6. The nanoporous layer (3) is a nanoporous silicon layer. This nanoporous silicon layer (3) is oxidized as SiOx and here x value is close to 2. FIG. 1(b) is the surface SEM image of the nanoporous silicon layer (3). The surface exhibits a porous structure with hillocks having few nanometer of sizes. At a closer view, it can readily be seen that this structure is composed of nanometer sized grains which are connected to each other in chains. The height of the hillocks or needle like structures can be up to 100 nanometer. The ends of the hillocks are needle like with diameters of few nanometers. These needle-like structures ease the injection of current. It is possible to produce porous structure on silicon surface by various methods. Reference can be given for example to: S. KALEM et al., NANOTECHNOLOGY 22 (2011); E. FRISCH et. J. APPL: PHYSICS 90, 4777(2001); U.S. Pat. No. 6,248,539; M. CHEUNG et al., SPIE J. Nanophotonics 5, 053503(2011). However, none of these methods report a silicon having a single peak emission at 1320 nm with a quantum efficiency greater than 50%. There is no publication reporting an infrared emission at 1320 nm from silicon using deuterium containing acid vapor. Deuterium induces exciting changes in silicon wafer surface as evidence from our investigation results.

FTIR investigation revealed the changes in microscopic structures of the Si wafer which was treated by heavy water incorporated acid vapor. The fact that the intensity of the oxygen band (Si—O—Si) observed at 1100 cm−1 representing early stages of the process is very strong after a treatment of 20 minutes as shown in FIG. 2, proves that there is an intense oxidation process going on right at the beginning of the reaction between the silicon wafer (4) and the deuterated acid vapor. The relative weakness of the Si—O—Si vibrational modes at later stages of the process (6 hours of treatment) as shown in FIG. 3 supports this observation.

Another benefit of an FTIR investigation is that it provides the evidence for the presence of bonded deuterium atoms within the matrix. This was demonstrated by the presence of N-D vibrational modes. The vibrations which were observed in FIG. 2 at 2425 cm−1 belong to N-D and N-D2 vibrations. Because these modes were shifted by 1.37 according to N—H modes at 3132 cm−1. This ratio is indeed very close to the mass ratios of deuterium and Hydrogen atoms, that is D/H=1.376. Thus, the replacement of H atoms by D atoms shifts the frequency to 2425 cm−1. We attribute the bands at 2425 cm−1 and 1260 cm−1 to stretching and bending vibrations of N-D modes and their presence and intensity are indicative of the presence of deuterium.

There is a very thin nanoporous silicon oxide (SiOx) layer (3) formed on the surface of the Si wafer treated by D2O containing acid vapor, wherein x is between 1 and 2. Its thickness can range from few nanometers up to few hundred nanometers depending on the treatment parameters. SEM-EDS measurements indicate that the atomic concentration of oxygen within this layer can be as high as 25%. This result shows that nanoporous silicon is oxidized or grains are covered by an oxide layer. A porous dielectric layer (6) is formed on the nanoporous silicon layer (3). This layer is a deuterium containing ammonium silicon hexafluoride $(ND_4)_2SiF_6$ (hereafter DASH) layer (6). The presence of this layer and the role played by deuterium atom in forming the surface have been determined by FTIR analysis. FIG. 2 and FIG. 3 show the FTIR spectra of the wafers treated by D2O containing acid vapor with p-Si(100) for 20 minutes and p-Si(111) for 6 hours, respectively. These spectra indicate that there is a strong oxidation process going on right at the early stages of the treatment process. The intensity variation of the Si—O band at 1100 cm−1 as a function of time provides the necessary evidence. The modes at 2524 cm−1 and 1260 cm−1 are associated with the N-D and N-D2 vibrations, respectively. They show that deuterium interacts with silicon and forms bonds within the DASH matrix. The DASH layer can be removed from the surface depending on the application by rinsing the wafer in deionized waters. However, it can play the role of an antireflection coating, for example in sensors or the role of a dielectric layer in laser cavities. Deuterium containing ammonium silicon hexafluoride (DASH) layer (6), is a fluoride layer formulated as (ND4)2SiF6 and having an optical emission.

Detailed investigations have shown that silicon wafer treated by D2O containing acid vapor exhibit exciting unique optical properties.

FIG. 4 shows a typical photoluminescence signal obtained from silicon treated with heavy water containing acid vapor. The spectrum indicates the presence of a single peak at 1320 nm with a full width at half maximum of about 200 nm when the sample is excited with an Argon laser line of 488 nm at room temperature. This emission can be originated from dislocations (T Hoang et al. IEEE Trans. On Electron Devices 54, 1860(2007)) or from impurities (O King et al. Physical Rev. B 50, 10661(1994)). However, a strong D1 dislocation luminescence should be expected at around 1500 nm if the dislocation effect is dominant. But this region is completely free from light emission. These observations indicate that the probability of having a dislocation emission is weak. But, the experimental demonstration of the presence of a silicon having a single peak emission at 1320 nm between 800-1800 nm with more than 50% photoluminescence quantum efficiency is very important for applications. Thanks to this invention, we can provide the semiconductor industry with the most needed silicon light source enabling photonic functions. There is no similarity between this invention and other silicon light sources having light emission in the infrared. This is the unique silicon light source in infrared region with more than 50% quantum efficiency and these features have not been previously observed.

As shown in FIG. 4, it was experimentally demonstrated that silicon which was treated using heavy water containing acid vapor emits at 1320 nm with a band width of 200 nm and having a quantum efficiency of greater than 50%. In efficiency estimation, it was assumed that 50% of the laser power was transmitted through the sample and about 25% is reflected.

EXAMPLE 1

LED (Light Emitting Diode)

FIG. 5(*a*) shows the structure of a silicon LED example. In this structure, electroluminescence was obtained by injecting carriers applying an electrical bias between the wafer (4) and the semi-transparent metal contact (1). Here, the wafer (4) is a single crystalline silicon and the metal contact (5) deposited at the back side of the wafer (4) can be Aluminum, silver (Ag) or gold (Au). For the semi-transparent metal contacts, a semi-transparent Au/Ti metal contact from the combination of gold layer (1) and Titanium layer (2) can be used. Before the contacts, a rutin surface cleaning procedures can be applied. As a concrete light source, under the form of an LED as defined in FIG. 5(*a*), a MIS (Metal-insulator-semiconductor) or a MOS (Metal-Oxide-Semiconductors) can be realized by treating the Si wafer (4) using heavy water containing acid vapor. In cases where it is necessary, DASH dielectric layer (6) can be removed and Au metallization directly deposited on treated Si. One preferred example consists of a p-type Si wafer (4) having resistivities of 1-20 Ohm-cm. The nanoporous silicon layer (3) formed on this wafer can be made very thin to enable quantum tunnelling. Here, the nanoporous silicon layer (3) is formed as a result of a heavy water containing acid vapor treatment. A semi-transparent Au layer (1) as metal contact was deposited on nanoporous silicon layer. In order to enhance the electrical quality of the metallization, a Titanium (Ti) layer (2) of 2-5 nm thick was deposited before the gold. As shown in FIG. 5(*b*) in another LED example, where the semi-transparent metal contacts (1) and the optional one (2) were directly deposited on DASH layer (6).

Light sources and other related devices can be realized by treating Si wafer using D2O containing acid vapor, where Si wafer (4) can have <111> or <100> crystal orientations and n-type or p-type conductivities. As backside metal contacts to Si wafer (4), 2000 Å aluminum (Al) can be deposited on the backside of the wafer. The wafer can then be annealed in hydrogen atmosphere in order to form Ohmic contacts. For the front side contacts, gold (Au) having thicknesses ranging from 5 to 20 nm can be used. Prior to Au metal contact, a Ti layer is deposited, where the thickness of this layer is between 2-5 nm.

The LED so produced can be used as a light source emitting at 1320 nm for a variety of applications such as optical communication, imaging and integrated circuits, boards and modules.

For a more concrete LED fabrication, N+Si wafer having resistivities of 0.006-0.015 Ohm-cm with <111> crystal orientation has been used. An Al layer of 2000 Å was coated as the backside contact, which was followed by heavy water D2O-acid vapor treatment. The wafer subsequently coated by a 5 Å Ti metal (2), which was followed by deposition of 20 nm of Au layer (1) as semi-transparent front metal contact. The I-V characteristics of such a device was shown in FIG. 6. This device is operational at thresholds as low as 0.2 Volt and exhibits a very good rectifying property. The device has a very low leakage current and no breakdown was observed at reverse bias till 3 volts. It was found that for better transparency, a Ti layer of 2-3 nm and a gold layer of 5-10 nm improve the device characteristics.

EXAMPLE 2

Chemical and Biological Sensor

An important sensor example is an LED sensor containing deuterated ammonium silicon hexafluoride (DASH) or (ND4)2SiF6 in its structure as shown in FIG. 5(*b*) showing the basic elements of such a sensor that is realized on a silicon wafer (4). Here the semitransparent metal contacts (1) and (2) are also transparent to chemical and biological agents and they are directly deposited on porous DASH layer (6). The front metal contacts (1) and (2) can be Au/Ti and have a porous transparent structure to agents. Metals such as Al/Cr or Au/Cr, Al/Ti can be used as front transparent metal contacts. The operation principal of the device is based on the current injection between the transparent front metal contact (1) and the optional metal contact (2) and the backside metal contact (5) to silicon wafer (4). The resulting light emission carries signature of the chemical or biological agents trapped within the porous structure. This device has a great potential in biological and chemical agent detection applications. Due to its porous structure, it can absorb large amount of agents in its cavity region which in turn leads to characteristic light emission properties relating to agents. In this device structure, both the nanoporous silicon layer (3) and the DASH layer (6) contribute to light emission source in visible and in infrared region.

Another configuration of this type of device use the LED structure shown in FIG. 5(a). The front metal contacts (1) and (2) are also transparent to chemical and biological agents. The front metal contacts can be made from metals such as Au, Ti, Cr, Al. The semitransparent front metal contact (1) and the optional one (2) are directly deposited on nanoporous silicon layer (3). This device having improved structural stability can be made functional using suitable materials for selectively detecting desired chemical and biological agents. The operation principal of the device is based on the current injection in between the front (1) and backside metal contacts (5) and detecting the changes in light emission characteristics. The electrical resistivity changes can also be probed and used for the same purposes.

EXAMPLE 3

Field Effect Transistor (FET) with Optical and Electrical Output

Heavy water treatment method can be successfully used in producing three terminal devices with new functionalities. An example of an application is shown in FIG. 7 which represents a FET structure having an optical output at 1320 nm on silicon wafer (4). The FET structure having n-type channel on p-type wafer is a double gate transistor with an optical output at 1320 nm in addition to the electrical output.

By applying heavy water-acid vapor treatment on the surface of a silicon wafer (4), a conducting channel with light emission property is formed between the source (10) and drain (11). For this FET structure, the dielectric DASH layer (6) is lifted off. The transparent metal contact (1) and the optional one (2) form the gate of the transistor and they are deposited on the thin nanoporous silicon layer (3). In order to ensure better optical output control, a second gate is formed on the back side of the wafer (4). For this purpose, the back side of the wafer is treated using acid vapor to reduce the thickness of the wafer to a desired value and thus forming a second thin nanoporous silicon layer (33) on the back surface. The backside metal contact (5) is then formed on this nanoporous silicon layer (33). The principal of this optical output FET is the following: when an electrical field above the threshold value is applied to the source (10) and the drain (11), some of the electrons drifting in the transistor channel between the source and the drain are trapped at the recombination centers in nanoporous silicon layers (3) and (33) thus producing a light emission corresponding to the optical output of the transistor representing the electrical component of the transistor. Thus, an optical output signal at 1320 nm can be obtained from the transistor operating under standard conditions. This provides an advantage of an electrically controlled device enabling optical communication, for example from chip to chip. The device can be used in quantum cryptography and quantum information processing applications by designing a suitable photonic structure.

EXAMPLE 4

Silicon Ridge Laser and Vertical Cavity Surface Emitting Laser (VCSEL)

It is proved that a VCSEL and a silicon ridge laser operating at 1320 nm whose active region is formed by heavy water acid vapor treatment can be produced. In what follows examples are provided concerning the applications to new device structure fabrication.

The example relates to the structure and operation principle of a silicon ridge laser made on SOI. Here the SOI consists of an oxide layer (7) grown on a secondary wafer (8) and a thin silicon layer (4) that is the matter of this invention, which was bonded to this oxide layer (7). The structure of such a laser is schematically shown in FIG. 8. The active region of the laser is the nanoporous silicon layer (3) which was formed by heavy water acid vapor treatment on the silicon wafer (4). The wafer described here is n-type Si (4) belonging to SOI. For an example of a silicon ridge laser, any DASH layer (6) which is formed during the treatment is removed. A p-type semiconductor layer (13) is deposited on the nanoporous silicon layer (3). The semiconductor layer can be p-type Si, SiC or GaN. The light source is activated by biasing an electrical field to the front metal contact (1) and the optional one (2) formed on semiconductor layer (13) and to the backside metal contact (5), formed on silicon wafer (4). The device is coated by a low dielectric constant insulating layer (14) such as polyimide or Silicon dioxide (SiO2). The laser cavity is formed between the SOI's oxide layer (7) and the ridge region formed by the dielectric layer (14). The laser output is enabled by photon emission resulting from the recombination of carriers in nanoporous silicon layer (3) which is amplified in the cavity under the ridge structure. Thanks to this device, high frequency optoelectronic systems can be realized. As an example, a monolithic integration of this device with a silicon based modulator can be realized enabling high frequency all silicon coding operations. In another device example for a silicon ridge laser is the formation of the same device keeping the DASH layer (6) on the nanoporous silicon layer (3) by replacing the p-type semiconductor layer (13). In this laser structure, the front side metal contact (1) and the optional one (2) is directly deposited on the DASH layer (6). This laser structure is different from current ridge laser technology offering even greater advantages from design, fabrication and functionalities point of view. The current state of the art Si ridge lasers use hybrid structures combining active regions of III-V compound semiconductors such as InP and Si wave guiding properties. Reference can be for example: RUMPLER J J et al., IEEE PHOTONICS TECHNOL LETTERS 21, 827(2009). In our invention, silicon ridge laser is made from silicon or other materials compatible with silicon. Moreover, the active region of the device is silicon based light source that is the subject of this invention.

FIG. 9 shows another example of a vertical cavity surface emitting laser (VCSEL) whose active region is formed by heavy water treatment of Si wafer (4) and emits at 1320 nm. For the fabrication of this laser, the bottom Bragg reflector structure consisting of a periodic Si/SiGe multilayer (19) is first formed on the silicon wafer (20), which was followed by the deposition of a silicon layer (4). The silicon layer (4) is then treated by heavy water process to form the nanoporous silicon layer (3). The top Bragg reflector consisting of Si and SiGe multilayers (18) is grown on the nanoporous silicon layer (3). Bottom and top bragg refrectors can also be fabricated by depositing Si/SiC or Si/SiN periodic multilayers. For the vertical cavity surface emitting laser, any DASH layer (6) is removed before the deposition of the top Bragg reflector. Carrier injection which is necessary for laser operation is made to the backside metal contact (5) and to the front side semi-transparent metal contacts (1) and optional (2). Light output is generated from the front side window through the transparent metal contacts. The remaining part of the device is insulated by a dielectric layer (22) from the environment. This layer can be a silicon nitride Si3N4 or a polyimide.

EXAMPLE 5

Optical and Electrical Output Heterobipolar Transistor (HBT)

Another example of this invention consists of an heterobipolar transistor producing an spontaneous optical signal from the base region when applied electrical signal to the emitter, collector and base regions. FIG. 10 shows schematically this HBT generating an spontaneous optical output at 1320 nm representing the electrical component of the transistor. For the fabrication of such a transistor, bottom n-Si collector C (44) is epitaxially grown on a silicon wafer (20). The growth is followed by the deposition of a p-type Si as a base layer (4). This base B layer is treated by heavy water acid vapor in order to form a thin nanoporous silicon layer (3) emitting at 1320 nm. The growth of the transistor is completed by the growth of an n-type emitter E (26). Any residual DASH layer (6) is lifted off for the fabrication of this HBT light emitting device. In metallization, the emitter E metallization is realized by the semi-transparent metal contact Au (1) and the optional one Ti (2). The fabrication is completed by the metallization (29) and (5) of the base region (4) B, the collector region (44) C, respectively. Herein, the backside metal contact (5) is the one contacting the collector (44). The operation principal of this photonic transistor consists of the recombination of carriers injected to the device at the nanoporous silicon layer (3) formed on the base layer (4). The light generated at 1320 nm in the base region (4) is transmitted through the top window as an optical output component representing the electrical component of the transistor. The remaining part of the device is insulated by a passivation layer (31).

This new light source technology can be used in a number of configuration and in next generation application fields:

1. In optical communication modules: free space and fiber optics applications;
2. Interconnections from chip-to-chip and in Multi-chip modules;
3. Infrared imaging and sensor systems;
4. Quantum cryptography and quantum computer applications;
5. Radar and communication antens;
6. Satellite systems;
7. Bio-medical applications, bio-chips;
8. Sensor systems (chemical and biological agent detection).

BRIEF DESCRIPTION OF DRAWINGS

Description of Drawings

Figure 1A:
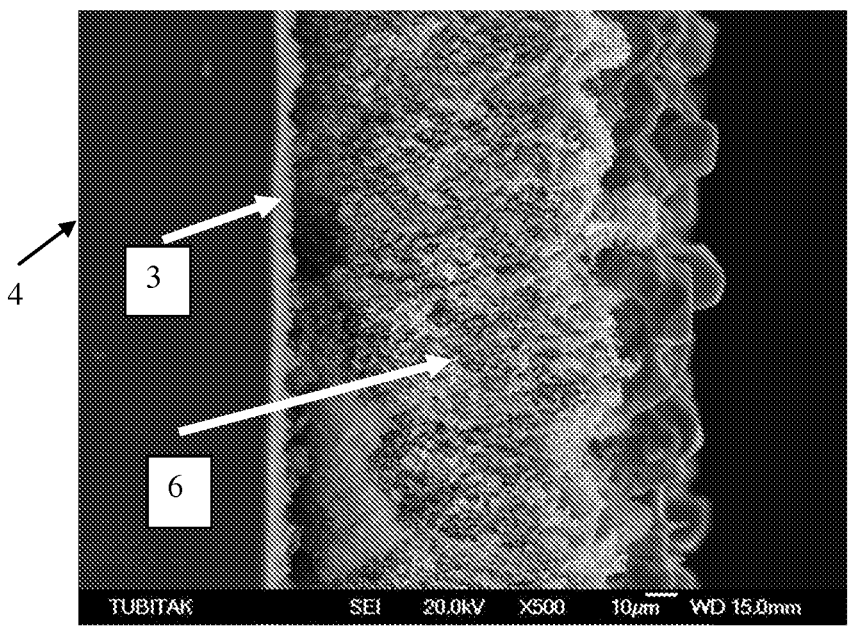
Figure 1B:
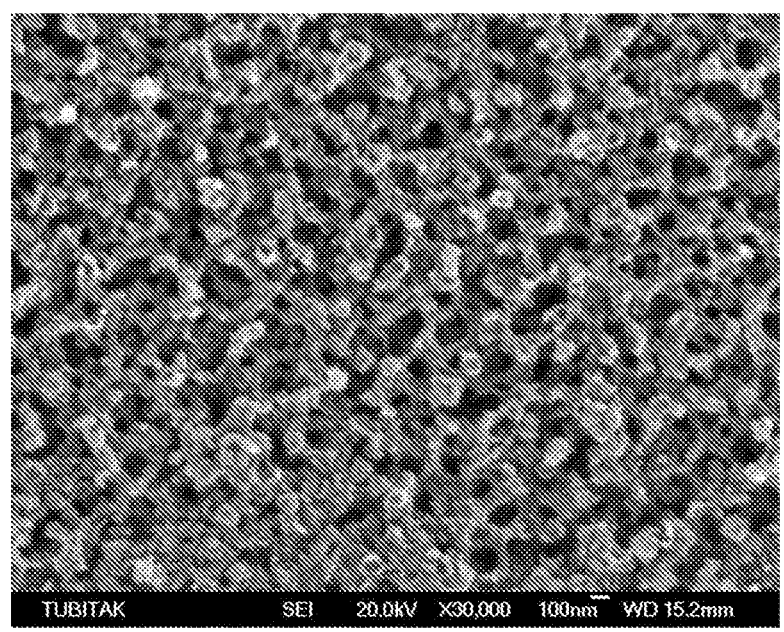

FIG. 1 (a) Cross-sectional SEM image of the wafer treated by heavy water-acid vapor, and b) surface image of the nanoporous silicon layer.

Figure 2:
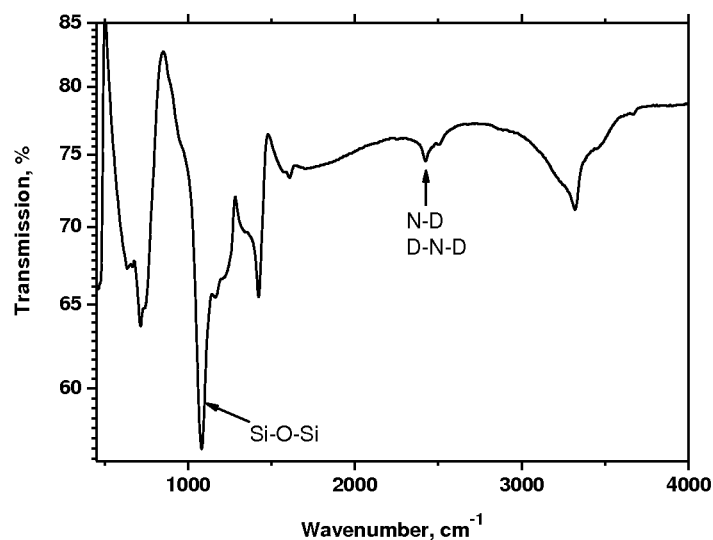

FIG. 2 FTIR spectrum of a heavy water treated Si wafer indicating the early stages of the interaction on a p-type Si (100) wafer for 20 minutes of treatment.

Figure 3:
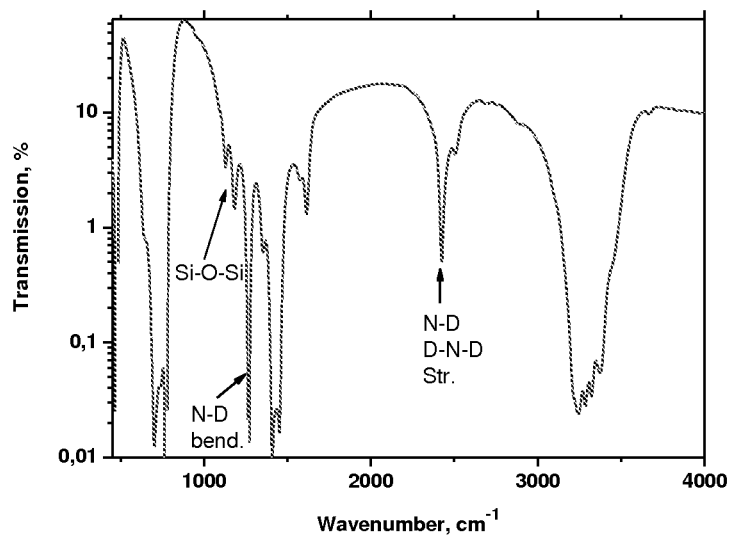

FIG. 3 FTIR spectrum of a heavy water treated Si wafer indicating the surface modification for an extended period of time on a p-type Si (111) wafer for 6 hours of treatment.

Figure 4:
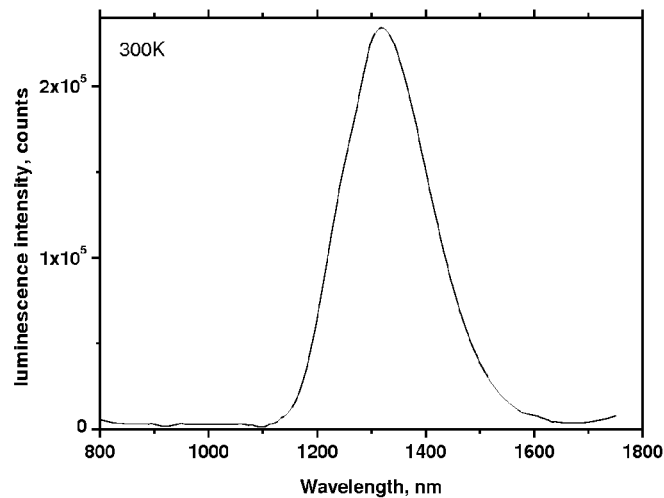
Figure 5A:
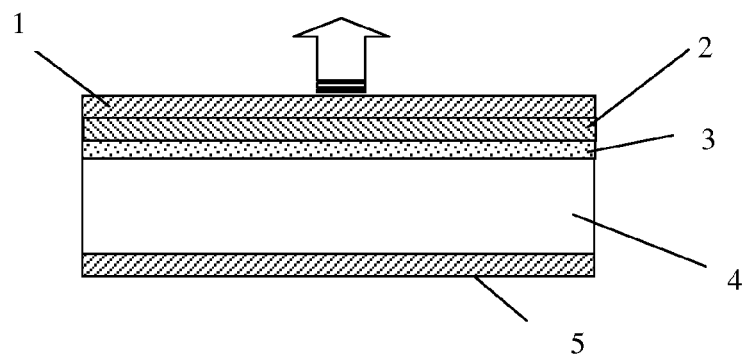
Figure 5B:
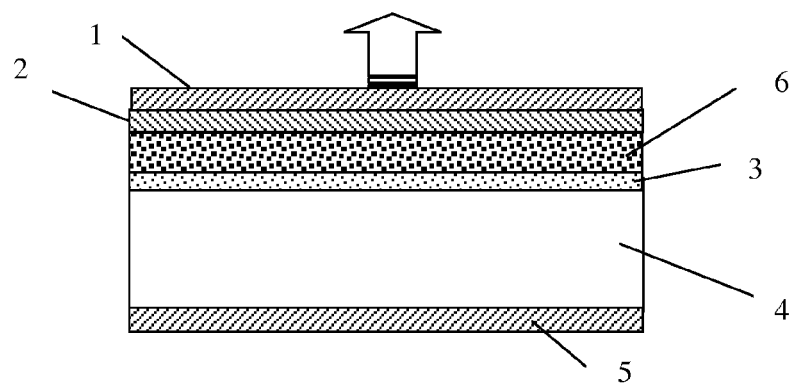
Figure 6:
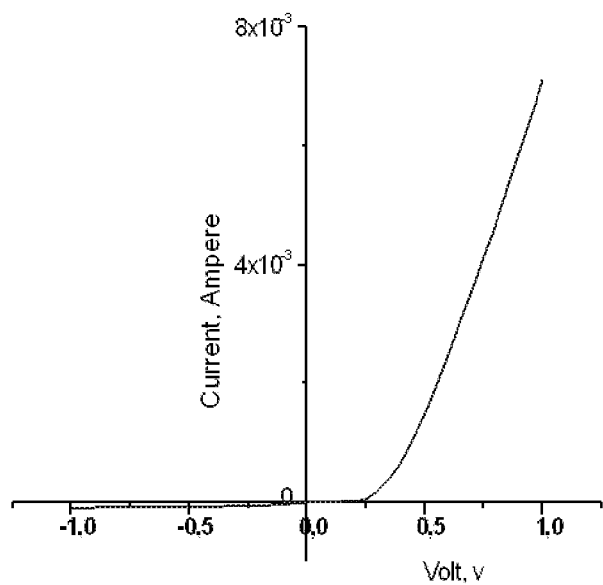
Figure 7:
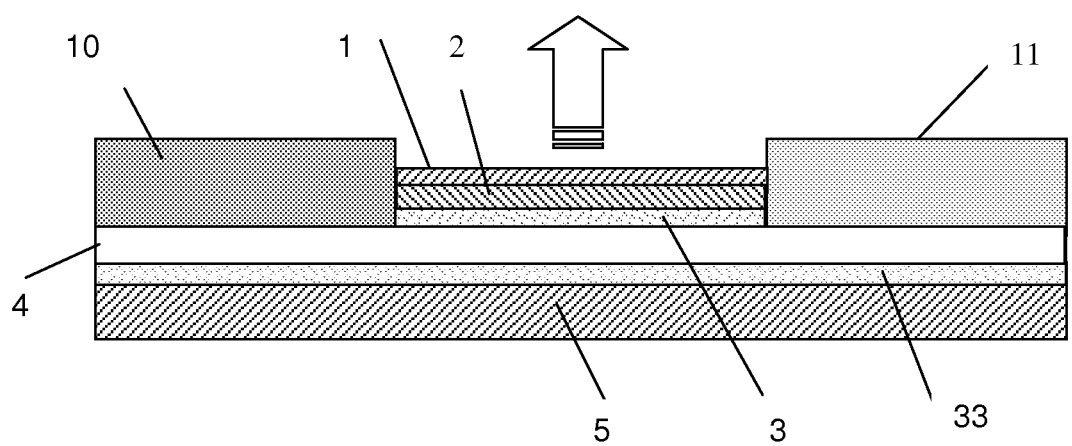
Figure 8:
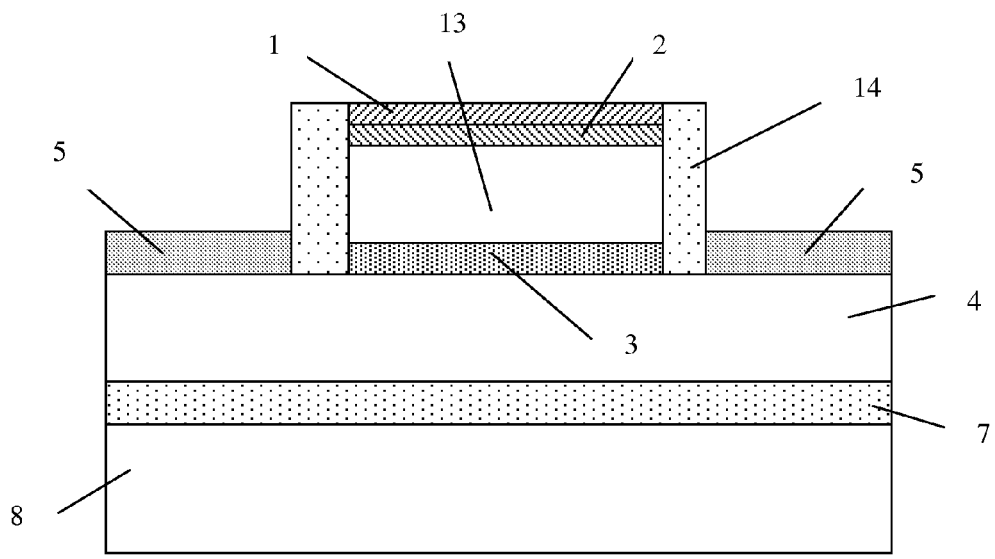

FIG. 4 Photoluminescence light emission obtained from silicon wafer treated by heavy water process;

FIG. 5 Schematic structure of the diode treated by heavy water vapor: a) metal contacts on nanoporous silicon layer, b) metal contacts on deuterated ammonium silicon hexafluoride;

FIG. 6 The I-V characteristic of a diode fabricated on a wafer treated by heavy water process;

FIG. 7 A field effect transistor (FET) structure produced by heavy water process having a spontaneous optical output representing electrical component;

FIG. 8 A sketch of the structure of a silicon ridge laser with an active layer formed by heavy water treatment.

Figure 9:
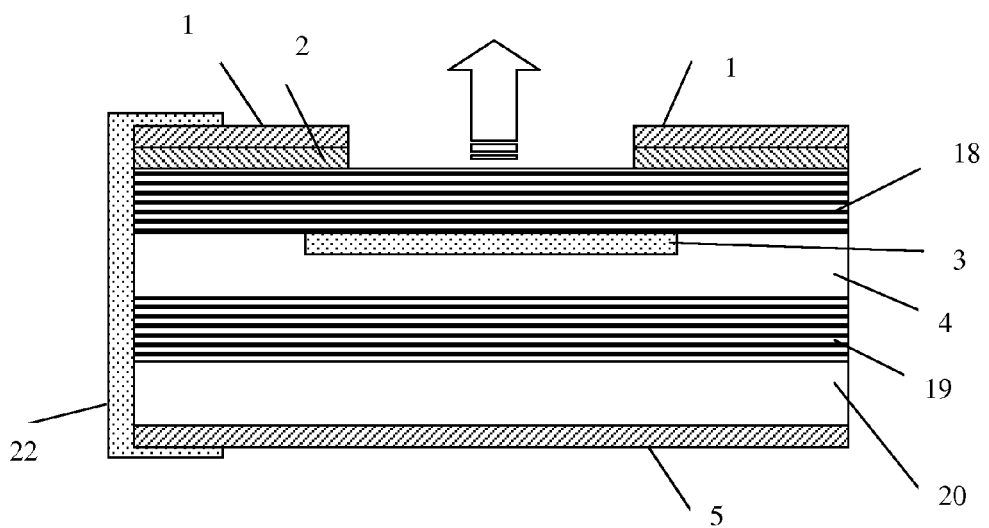
Figure 10:
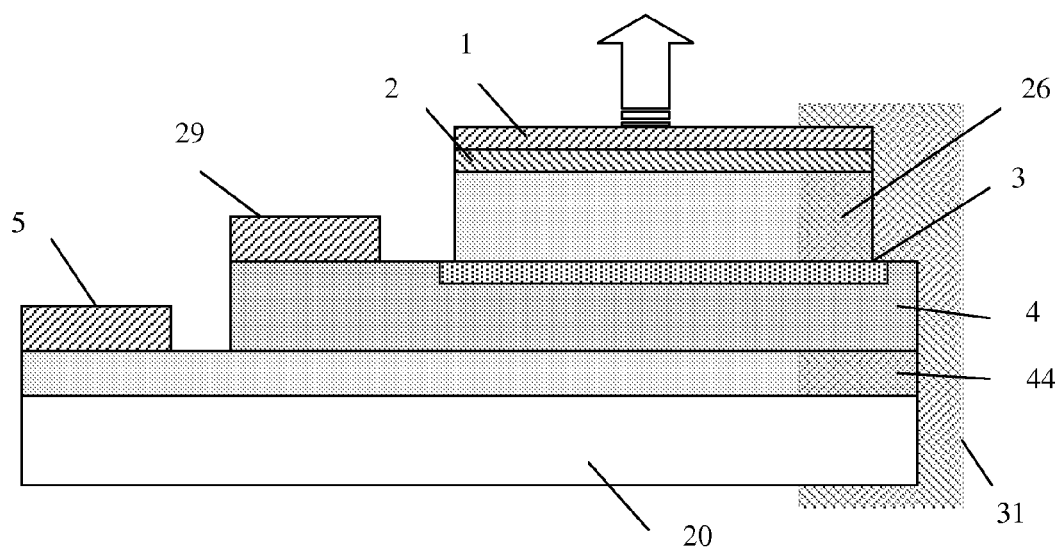

FIG. 9 A sketch of a VCSEL laser structure wherein the active region is formed by heavy water treatment process;

FIG. 10 An example of an heterobipolar transistor having an spontaneous optical output signal representing the electrical component of the transistor.

The invention claimed is:
1. A method for producing a silicon light source, comprising:
    etching the surface of a silicon wafer (4) by acid vapor of heavy water $D_2O$ containing $HF:HNO_3$ chemical mixture; wherein the silicon wafers (4) are single crystal silicon wafers having <100> or <111> crystallographic orientations and conductivities of n-type or p-type;
    forming a nanoporous silicon layer (3) on the silicon wafer (4);
    forming a deuterated ammonium silicon hexafluoride $(ND_4)_2SiF_6$ layer (6) on the nanoporous silicon layer (3); wherein the nanoporous silicon layer (3) further comprises a silicon dioxide $SiO_x$, wherein the x value is close to 2;
    wherein the heavy water (deuterium oxide, $D_2O$) containing chemical mixture comprises a weight ratio of the HF solution of 40-50%, a weight ratio of the $HNO_3$ solution of 60-70%; wherein a proportion of 2 to 7 unit volume from HF, 1 to 12 unit volume from $HNO_3$ and 1 to 6 unit volume from $D_2O$ are used.

* * * * *